United States Patent
Wang et al.

(10) Patent No.: US 9,088,121 B2
(45) Date of Patent: Jul. 21, 2015

(54) PACKAGE MODULE, PACKAGE TERMINAL AND MANUFACTURING METHOD THEREOF

(71) Applicant: Delta Electronics (Shanghai) CO., LTD., Shanghai (CN)

(72) Inventors: Xianming Wang, Shanghai (CN); Shouyu Hong, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 35 days.

(21) Appl. No.: 13/844,265

(22) Filed: Mar. 15, 2013

(65) Prior Publication Data

US 2014/0141631 A1 May 22, 2014

(30) Foreign Application Priority Data

Nov. 16, 2012 (CN) .......................... 2012 1 0464621

(51) Int. Cl.
*H01R 12/57* (2011.01)
*H01R 43/16* (2006.01)
*H01R 13/05* (2006.01)

(52) U.S. Cl.
CPC ................ *H01R 43/16* (2013.01); *H01R 12/57* (2013.01); *H01R 13/05* (2013.01); *H01L 2224/48472* (2013.01); *H01L 2224/49111* (2013.01); *Y10T 29/49204* (2013.01)

(58) Field of Classification Search
CPC .... H01R 12/57; H01R 13/6315; H01R 13/11; H01R 23/725; H01R 4/02

USPC ............................................ 439/246, 83, 876
See application file for complete search history.

(56) References Cited

U.S. PATENT DOCUMENTS

| | | | | |
|---|---|---|---|---|
| 2,972,728 | A * | 2/1961 | Cole | 439/246 |
| 3,295,097 | A * | 12/1966 | Van Horssen et al. | 439/746 |
| 3,864,000 | A * | 2/1975 | Coller et al. | 439/246 |
| 4,773,877 | A * | 9/1988 | Kruger et al. | 439/482 |
| 4,854,882 | A * | 8/1989 | Corridori | 439/83 |
| 5,334,035 | A * | 8/1994 | Wehrle et al. | 439/252 |
| 5,356,299 | A * | 10/1994 | Kunishi et al. | 439/83 |
| 7,080,999 | B2 * | 7/2006 | Narui et al. | 439/246 |
| 7,503,767 | B2 * | 3/2009 | Pai | 439/66 |
| 2001/0036768 | A1 * | 11/2001 | Hasegawa et al. | 439/595 |

(Continued)

FOREIGN PATENT DOCUMENTS

| | | |
|---|---|---|
| TW | 200402815 | 2/2004 |
| TW | 200742055 | 11/2007 |

(Continued)

OTHER PUBLICATIONS

Intellectual Property Office, Ministry of Economic Affairs, R.O.C., "Office Action", dated Sep. 29, 2014, Taiwan.

*Primary Examiner* — Gary Paumen
(74) *Attorney, Agent, or Firm* — Morris, Manning & Martin LLP; John R. Harris

(57) ABSTRACT

A package terminal is provided, which comprising: a base; an end portion with a first section; and a bent portion having a C-shape bend with a gradual change section, wherein the bent portion includes a first end and a second end, the first end is connected to the end portion, the second end is connected to the base, the bent portion includes a second section, and an area of the second section is smaller than an area of the first section.

20 Claims, 30 Drawing Sheets

(56) References Cited

U.S. PATENT DOCUMENTS

2008/0032517 A1* 2/2008 Pai .................................. 439/61
2008/0171478 A1* 7/2008 Tsai ............................. 439/862

FOREIGN PATENT DOCUMENTS

TW 200834641 A 8/2008
TW 201145728 A1 12/2011

* cited by examiner

PACKAGE MODULE, PACKAGE TERMINAL AND MANUFACTURING METHOD THEREOF

CROSS-REFERENCE TO RELATED APPLICATIONS

This application claims benefits of Chinese Patent Application No. 201210464621.6, filed on Nov. 16, 2012 in the State Intellectual Property Office of China, the disclosure of which is incorporated herein by reference in its entirety.

TECHNICAL FIELD

The present disclosure relates to a power device technology field, particularly relates to a package terminal, a package module having the package terminal and a manufacturing method for the package terminal.

BACKGROUND

With the increasing requirement of the power system for efficiency, power density, reliability, installing convenience, the power device develops from the discrete devices to the modular devices. The power modularization becomes an important trend in the power electronics industry. Due to a number of semiconductor chips and some logic, control, detection and protection circuits being integrated therein, the power device can be conveniently applied. The system volume and the development time are decreased, and the reliability of the system is greatly improved.

Due to the harsh environment for product application, the power electronic product may have structure failures after long working hours. Thus more and more attention is paid to improving the reliability of the power electronic product. The optimal design of the structural stress is important for improving the reliability of the power electronic product.

In the related art, the package terminal of the package module of the power device is shown in FIGS. 1 and 2A-2C. The package terminal includes an end portion 91 and a base 93. The base 93 of the package terminal is connected through the solder 94 to the substrate 95, such as a Direct Bonded Copper (DBC) substrate, a Direct Bonded Aluminum (DBA) substrate, a metallized ceramic substrate or a Low Temperature Co-fired Ceramic (LTCC) substrate. The end portion 91 is bonded to the PCB 96. Thereby the signal transmission between the power device and the PCB 96 is achieved. By the impact of the structure and the application of the package terminal, the failure risks of the package terminal in the related art are shown as follow.

Firstly, due to the different coefficient of thermal expansion of various materials in the application, the thermal stress is generated in the package module. Because strength of the material of soldering interface is lower, the fracture of the soldering layer between the package terminal and the substrate becomes one of the major failure forms.

Secondly, due to the manufacture tolerance and the location deviation of the terminal, the fracture of the soldering layers can also be generated from the continuous mechanical interference force after assembly. In addition, in the storage and service process, the damage at the soldering layers can also be generated by various external mechanical vibrations.

In order to overcome the above drawbacks, many technical solutions are proposed. The Z-shape terminal is shown in FIGS. 2A-2C. The Z-shape bend is applied to the root (i.e., the bent portion 92) of the package terminal to release the stress. The stress is significantly reduced after the design of FIGS. 2A-2C is applied.

The experimental value of the mechanical property of the Z-shape terminal is shown in FIG. 3, in which the horizontal axis shows the deflection (mm), and the vertical axis shows the normal force (kgf). In the package terminal (e.g. Z-shape terminal) in the related art shown in FIG. 3, the elastic property in the two directions perpendicular to each other is very different (Dir.1 indicates the bending direction; Dir.2 indicates the direction perpendicular to the bending direction). As shown in FIG. 3, the solid line presents the mechanical property in Dir.2 direction, the dashed line presents the mechanical property in Dir.1 direction, the elasticity value of K (the ratio value of the vertical axis value and the horizontal axis value) is in a range of 0.080 to 0.394 kgf/mm, which means the stress-releasing effect in Dir.1 direction is better than that in Dir.2 direction.

Based on the above experimental value, as the direction of the external force is highly uncertain during the actual application, the installing direction of the package terminal is thus randomly allocated in general. The obvious drawback is that when the external force direction is concordant with the direction perpendicular to the bending direction, the soldering point generally withstands a relatively large stress, which may cause the risk of failure. Thus, it is necessary to further improve the reliability of the package terminal in the related art.

SUMMARY

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

According to an aspect of the disclosure, a package terminal is provided, which comprising: a base; an end portion with a first section; and a bent portion having C-shape bend with a gradual change section, wherein the bent portion includes a first end and a second end, the first end is connected to the end portion, the second end is connected to the base, the bent portion includes a second section, and an area of the second section is smaller than an area of the first section.

According to another aspect of the disclosure, a package module is provided, which comprising: a carrier member including a plurality of soldering pads; a plurality of package terminals as above described, wherein the base of the package terminal is fixed to the soldering pad.

According to another aspect of the disclosure, a manufacturing method for a package terminal is provided, which comprising steps of: forming a base, a end portion and a bent portion between the base and the end portion; processing the bent portion to have a gradual change section; bending the bent portion in a direction such that an area of a second section of the bent portion is smaller than an area of a first section of the end portion.

For example, the first section and/or the second section is round, oval, rectangular or regular polygonal.

For example, the package terminal has a central axis, the first section and the second section are perpendicular to the central axis, the first section has a maximum sectional area among all of sections perpendicular to the central axis of the end portion, and the second section has a minimum sectional area among all of the sections of the bent portion.

For example, the area of the second section is less than or equal to 0.7 times of the area of the first section.

For example, the first section and the second section are round, a diameter of the second section is less than or equal to 0.8 times of a diameter of the first section.

For example, the first section and the second section are regular polygonal, a side length of the second section is less than or equal to 0.8 times of a side length of the first section.

For example, the first section and the second section are rectangular, a side length of the second section is less than or equal to 0.8 times of a side length of the first section in a direction of an opening direction of the bent portion and perpendicular to a direction of the central axis.

For example, a distance between the first end and the second end of the bent portion is larger than or equal to twice the side length of the first section in a direction of an opening direction of the bent portion and perpendicular to a direction of the central axis.

For example, a distance between a center of the second section and the central axis is larger than or equal to half of the diameter of the first section.

For example, a distance between a center of the second section and the central axis is larger than or equal to half of the diameter of the first section.

For example, a distance between a center of the second section and the central axis is larger than or equal to half of the side length of the first section in an opening direction of the bent portion.

For example, further comprising a chamfer at a top of the end portion.

For example, further comprising a groove around a cylindrical surface of the base.

For example, further comprising a plurality of grooves forming a starlike structure or an intersecting parallels structure on a bottom surface of the base.

For example, the bent portion comprises two to four C-shape bends arranged end to end and uniformly along a circumferential direction.

For example, the C-shape bend is a bend in a single direction or a gradual change bend in a circumferential direction at a predetermined angle.

For example, a material of the bent portion is the same as or different from that of the base or the end portion.

For example, while processing the bent portion to form the gradual change section, a section with a minimum sectional area is at a center of the bent portion.

BRIEF DESCRIPTION OF THE DRAWINGS

The present disclosure will become more fully understood from the detailed description given hereinafter and the accompanying drawings which are given by way of illustration only, and thus are not limitative of the present disclosure.

DETAILED DESCRIPTION

Figure 1:
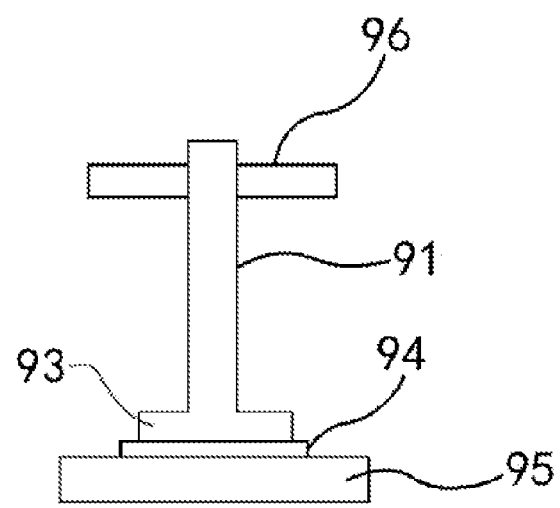
FIG. 1 is an application diagram of a package terminal in the related art.
Figure 2A:
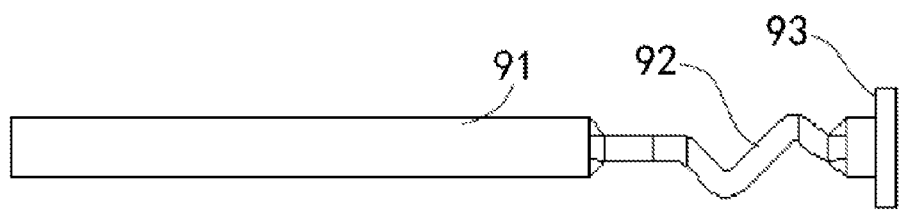
FIG. 2A is a front view of a package terminal in the related art.
Figure 2B:
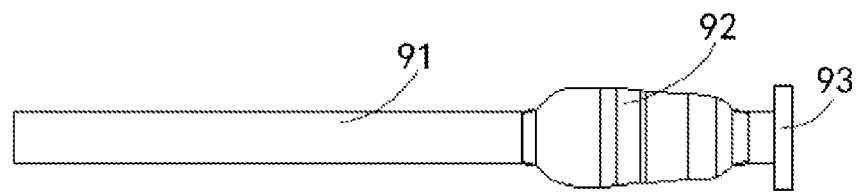
FIG. 2B is a top view of a package terminal in the related art.
Figure 2C:
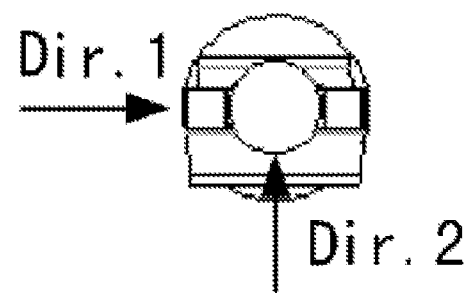
FIG. 2C is a left view of a package terminal in the related art.
Figure 3:
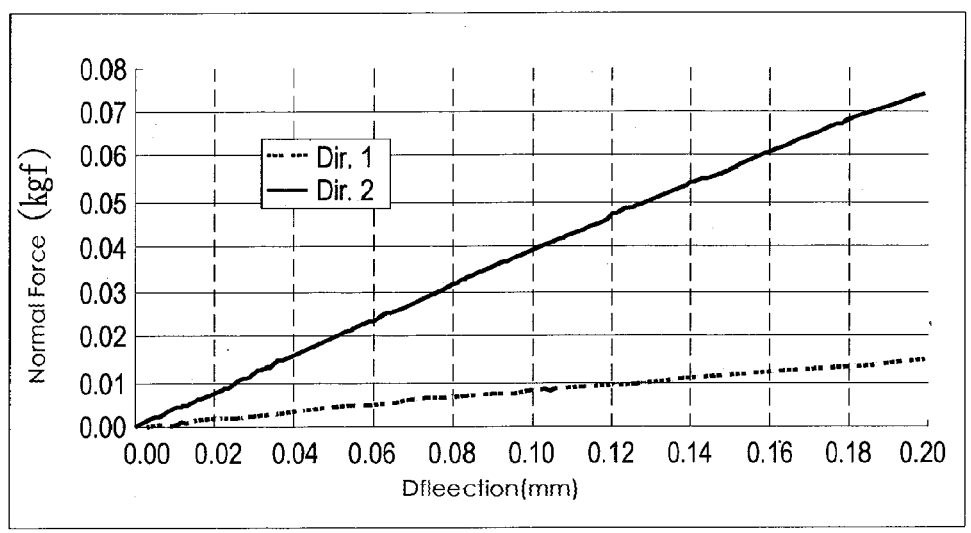
FIG. 3 is a schematic view showing the mechanical property of a package terminal in the related art.

Exemplary embodiments of the present disclosure are described more fully hereinafter with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity.

The package module of the embodiment can include the package terminal of any embodiment of the present disclosure. The package terminal of the embodiment can be manufactured through the manufacturing method for package terminal of the disclosure.

The package terminals according to embodiments of the present disclosure are hereafter illustrated.

A First Embodiment

Figure 5:
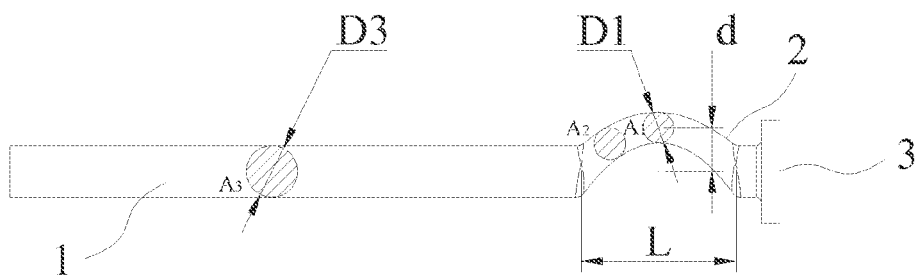
FIG. 5 is a front view of the package terminal of the first embodiment of the present disclosure.
Figure 6:
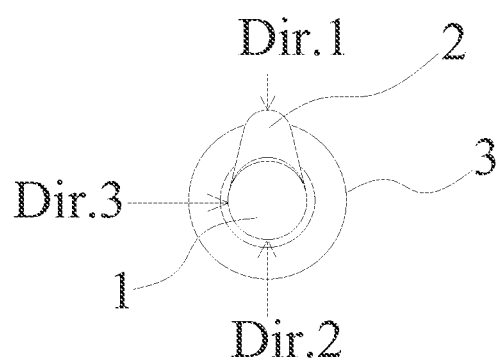
FIG. 6 is a left view of the package terminal of the first embodiment of the present disclosure.

As shown in FIGS. 5 and 6, the package terminal of a first embodiment includes an end portion 1, a bent portion 2 and a base 3, in which a first end of the bent portion 2 is connected to the end portion 1, a second end of the bent portion 2 is connected to the base 3. In this embodiment, the end portion 1 and the base 3 are the same as that of a conventional package terminal. The difference between this embodiment and the related art is that the bent portion 2 has a C-shape bend with a gradual change section, in which the sectional area is maximum at two ends of the bent portion 2 and minimum at the center of the bent portion 2. The section at the center of the bent portion 2 is referred to as a second section. The sectional area from two ends to the center of the bent portion 2 becomes gradually smaller, and the second section (the minimum section) is at the center of the bent portion 2, i.e., at the center of the C-shape bend in left-right direction as shown in FIG. 5. The C-shape in the present specification refers to a shape being the same as or similar to the letter C formed through a smooth transition.

As shown in FIG. 5, in this embodiment, the end portion 1 and the base 3 have an elongated cylindrical shape and a stubby cylindrical shape, respectively, in which case the section of the end portion 1 is round. The section mentioned in the present specification is referred to as cross-section, without otherwise indicated. For curved parts such as the bent portion 2, the section is in the direction of the radius of curvature thereof, therefore the sections at respective positions of the bent portion 2 are round. It should be noted that in the present specification, the section having the maximum area in the end portion 2 is defined as a first section. The axis of the end portion 1 and the axis of the base 3 are in a line, and thus the line is referred to as a central axis of the entire package terminal. Both the first section of the end portion 1 and the second section of the bent portion 2 are perpendicular to the central axis. When the end portion 1 is in the other geometric shape, if the geometric centers of all the sections of the end portion 1 are in the same line, which is collinear with the axis of the base 3, then this line is the central axis of the entire package terminal.

As shown in FIG. 5, the label of L represents the length of the bent portion 2 (i.e., the distance between the first end and the second end of the bent portion), the label of d represents the offset distance between the center of the second section (i.e., the center of the circular section) and the central axis of the entire package terminal. In other words, the label of d represents the vertical distance from the center of the second section to the central axis. The labels of D1 and A1 represent the diameter and the area of the second section respectively. The labels of D3 and A3 represent the diameter and the area of the first section respectively. The label of A2 represents the sectional area at any other gradual change position of the bent portion 2, and thus it is obvious that A1<A2<A3. For example, one or more or all of the following four relationships are met, and the ratio among L, d and D1 is adjusted for adjusting the mechanical property of the package terminal.

L≥2D3, i.e., the length of the bent portion is larger than or equal to twice the diameter of the first section;

A1≤0.7A3, i.e., the sectional area of the second section is less than or equal to 0.7 times that of the first section;

D1≤0.8D3, i.e., the diameter of the second section is less than or equal to 0.8 times that of the first section;

d≥0.5D3, i.e., the offset distance from the center of the second section to the central axis is more than or equal to the radius of the first section.

Figure 4:
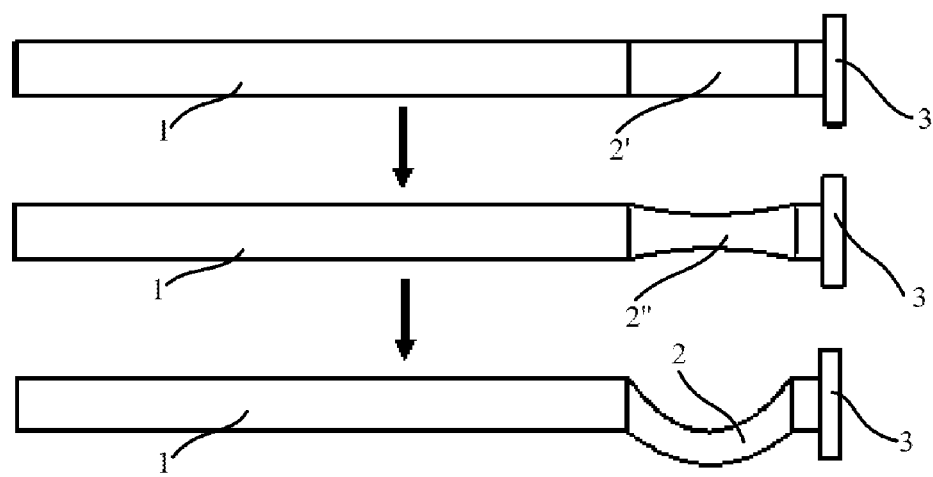
FIG. 4 is a schematic view of a manufacturing method for the package terminal of the first embodiment of the present disclosure.

The present disclosure provides manufacturing methods for the package terminal according to the first embodiment. A first manufacturing method includes the steps of a base formation, a gradual change section processing, and a bending processing. A second manufacturing method includes the steps of a gradual change section processing, a bending processing and a base formation. And so forth, there are six kinds of manufacturing methods by combination. As shown in FIG. 4, the first manufacturing method includes the following steps:

Forming a base 3, an end portion 1 and a portion 2' to be bent between the base 3 and the end portion 1, using the supplied material;

Through a gradual change section processing, transforming the portion 2' to a portion 2" with a gradual change section before bending the portion 2';

Bending the portion 2" to one direction to form a bent portion 2 such that any sectional area of the bent portion 2 is less than that of the end portion 1.

In the step of the gradual change section processing mentioned above, the position of the second section may be selected at the center of the portion 2'.

Alternatively, the base 3, the end portion 1 and the bent portion 2 are made of the different materials or independent components to increase the weldability of the base 3 and optimize the reliability of the bent portion 2 and extend the flexibility of the end portion 1.

After finishing the structure manufacturing, a heat treatment or a plating treatment to a part of the product or the entire product is performed to improve the mechanical property and the corrosion resistance.

The characteristics of the package terminal of the first embodiment is illustrated as the following by referring to the test data of the mechanical property.

Figure 7:
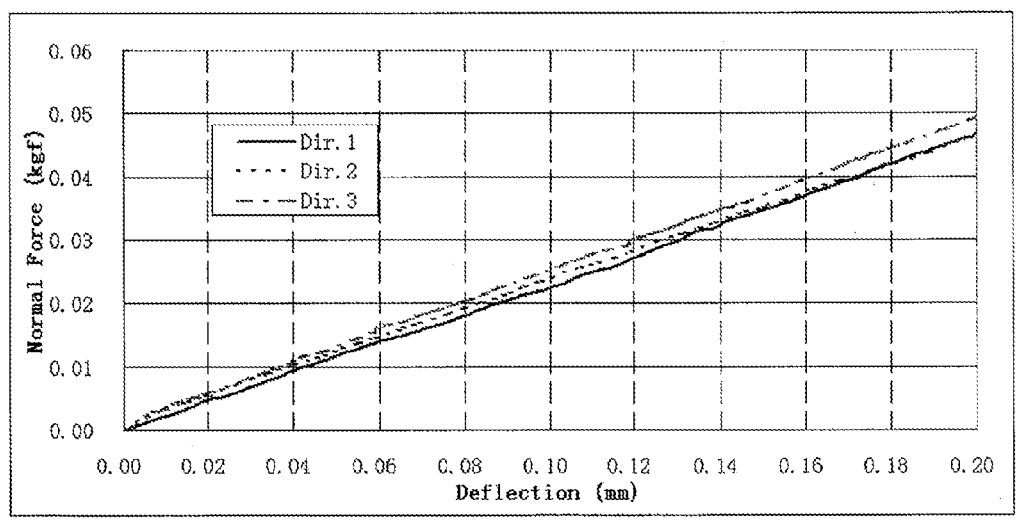
FIG. 7 is a schematic view showing the mechanical property of the package terminal of the first embodiment in the present disclosure.

The present disclosure essentially proposes another new solution to release stress of the package terminal, in which the elasticity function of the C-shape bent portion 2 is used to achieve the effect of releasing stress. The mechanical property of the package terminal in the first embodiment is shown in FIG. 7. The mechanics difference in three directions of the package terminal is small, in which Dir.1 represents the direction opposite to the opening of the C-shape bent portion 2, Dir.2 represents the direction facing the opening direction of the C-shape bent portion 2 and opposite to the Dir.1 direction, Dir.3 represents the direction perpendicular to the opening of the C-shape bent portion 2, the solid line represents the mechanical property in the Dir.1 direction, the dot line represents the mechanical property in the Dir.2 direction, and the dash-dotted line represents the mechanical property in the Dir.3 direction. The elasticity value K of the present package terminal is in the range of 0.225~0.251 kgf/mm. There is no particular selectivity in three directions of the present package terminal. In other word, the present package terminal has a good performance of releasing the isotropic stress, which is favorable to dealing with complex working conditions and improves reliability of the package module.

Figure 8:
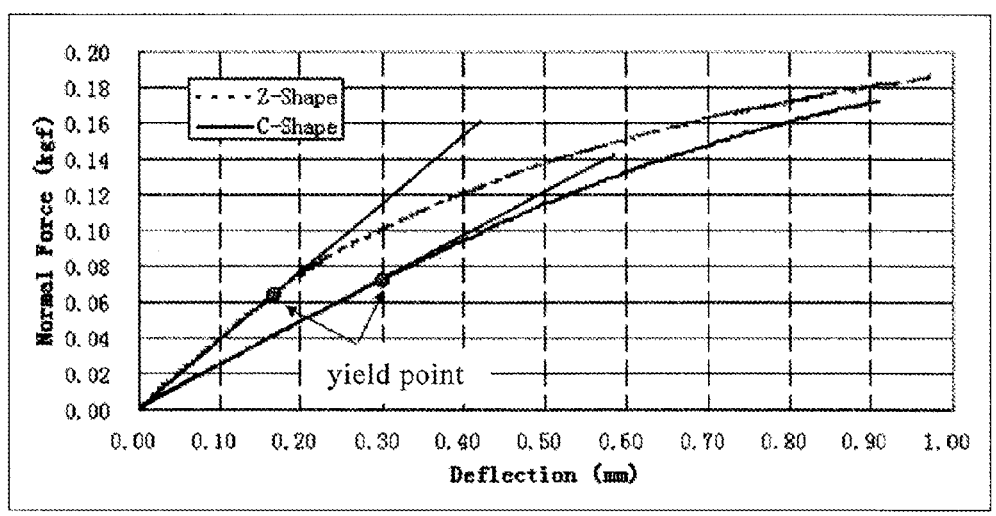
FIG. 8 is a schematic view comparing the mechanical property between the package terminal of the first embodiment of the present disclosure and that of the related art.

By comparing the mechanical property in the maximum elasticity direction of the related art with that of the present disclosure, which is perpendicular to the bending direction for the Z-shape bent portion of the related art and is perpendicular to the opening direction of the bent portion 2 for the C-shape bent portion 2 of the present disclosure), it is found that as shown in FIG. 8 the yield point of the package terminal of the present disclosure is 60% higher than that of the related art, in which the solid line represents the mechanical property of the package terminal of the present disclosure, and the dashed line represents the mechanical property of the package terminal of the related art. In other words, under the same deflection, the material yield is less likely to occur in the package terminal of the present disclosure than in that of the related art. The material yield may cause permanent structural deformation to the package terminal. Therefore, the package terminal of the present disclosure has high safety.

Figure 9:
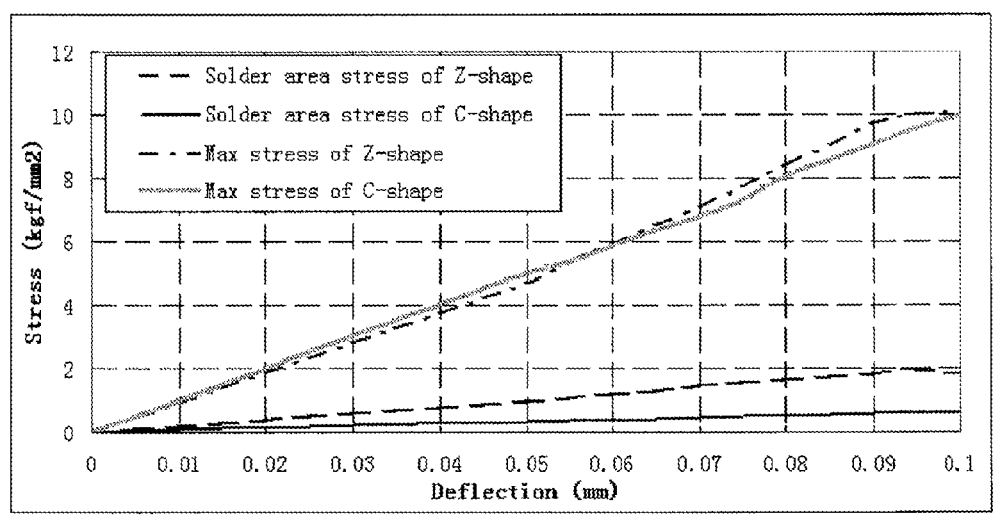
FIG. 9 is a schematic view comparing the maximum stress in the solder area and maximum internal stress of the package terminal of the first embodiment of the present disclosure and that of the related art.

To compare the effect of releasing the stress in the package terminal of the related art with that of the present disclosure, the maximum stress thereof and the maximum stress in the solder area shown in FIG. 9 is obtained by a simulation method, in which the solid line represents the correlation between the maximum stress in the solder area and the deflection of the package terminal in the present disclosure, the dashed line represents the correlation between the maximum stress in the solder area and the deflection of the package terminal in the related art, the hollow line represents the correlation between the maximum stress and the deflection of the package terminal in the present disclosure, and the dash dotted line represents the correlation between the maximum stress and the deflection of the package terminal in the related art. From the above comparison, it can be concluded that when subject to the same deflection, structures of the present disclosure and the related art have the same maximum stress, but the maximum stress in the solder pad (i.e., solder area) of the present disclosure is much smaller than that of the related art. The smaller stress in the solder pad contributes to the higher reliability of the soldering layer. The reliability of the C-shape bent portion of the package terminal in the present disclosure is higher than that of the Z-shape bent portion of the package terminal in the related art.

Figure 10:
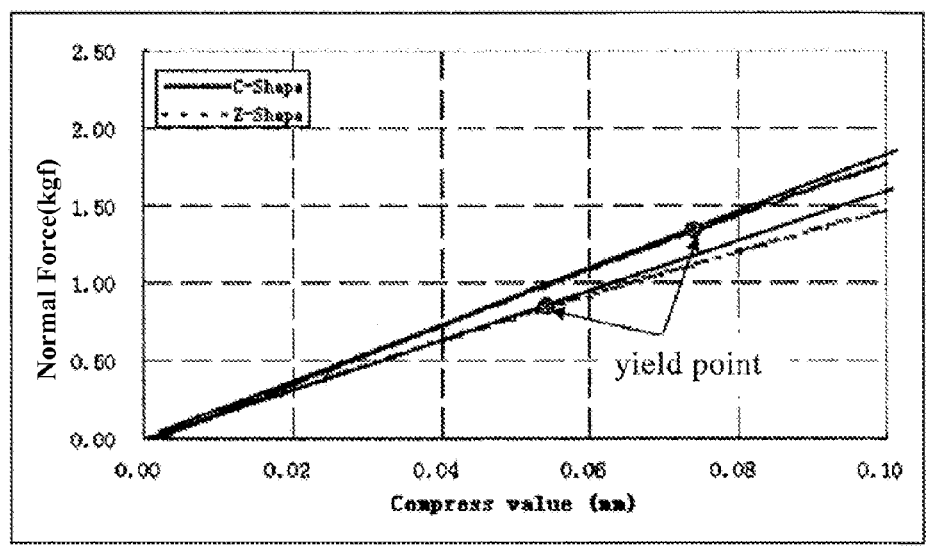
FIG. 10 is a schematic view comparing the mechanical property in the height direction of the package terminal of the first embodiment of the present disclosure and that of the related art.

Further, when subject to stretching or compressing in the height direction, the package terminals of the present disclosure and the related art can both release stress, and can adjust the elasticity in the height direction by adjusting the ratios among L, d and D1. Compared with the package terminal of the related art, the package terminal of the present disclosure has a higher yield point, thus is advantageous in the mechanical property in the height direction. Due to the location deviation in the assembly or the vibration in the operation, the package terminal is subject to force in the height direction. In this case, the elasticity structure of the package terminal in the present disclosure will protect the package terminal. The test data of the mechanical property in the height direction is shown in FIG. 10, in which the x-coordinate represents compress value (in mm), the y-coordinate represents reaction force (in kgf), the solid line represents the mechanical property of the package terminal in the present disclosure, and the dashed line represents the mechanical property of the package terminal in the related art.

Figure 11:
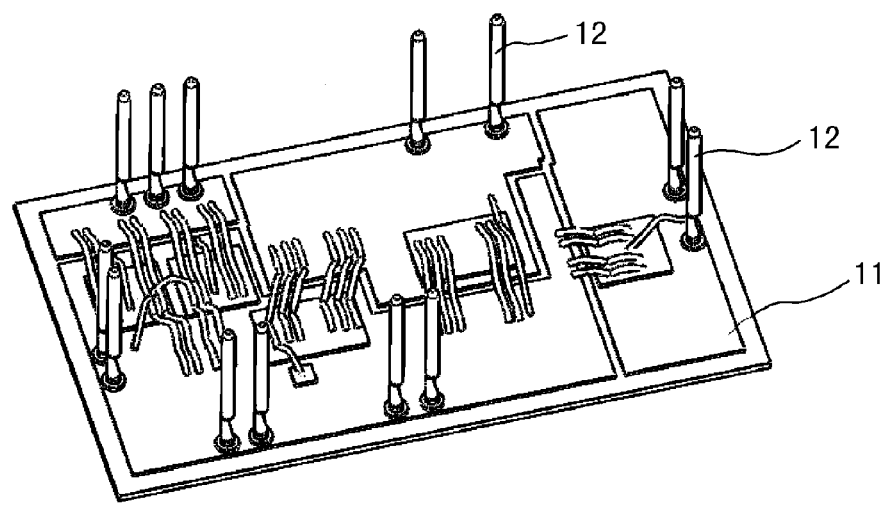
FIG. 11 is an application diagram for a package terminal of the first embodiment of the present disclosure.

The specific applications of the package terminals in the embodiments of the present disclosure are shown in FIG. 11. A plurality of package terminals 12 are arranged in various positions to realize various connection functions, thus the package terminal 12 of the present disclosure can be widely applied in the package design. The package module of the present disclosure comprises a substrate and a plurality of package terminals 12 according to embodiments of the present disclosure.

Figure 12:
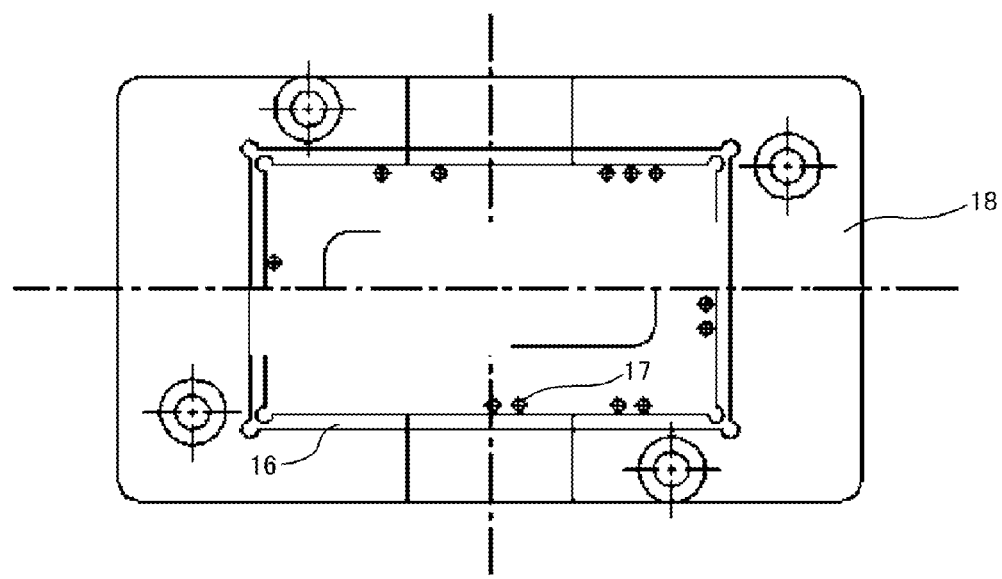
FIG. 12 is a schematic view of an installing tool of the package terminal of the first embodiment of the present disclosure.

In the above embodiment, the package terminal 12 is located by a tool 18 as shown in FIG. 12 during the soldering process. The package terminals 12 passing through the terminal locating holes 17 and the substrate 11 which is located according to the substrate locating edges 16 are fixed in the tool 18 (for example reflow soldering tool). The package terminal 12 is soldered to the soldering pad of the substrate 11 through the reflow soldering method. Since there is no direction difference in the mechanical property of the products, the installation direction of the package terminal 12 during the soldering process can be assigned randomly to facilitate quick installation.

The package module of the embodiment of the present disclosure comprises a carrier member and package terminals, in which for example, the carrier member is the substrate 11 having a plurality of soldering pads, and the base 3 of the package terminal is soldered to the soldering pads.

The other eight embodiments of the disclosure will be described hereafter. Similar to the first embodiment, the package terminals according to other embodiments comprise the end portion 1, the bent portion 2 and the base 3. The mechanical properties thereof are also similar to that of the first embodiment. Thus, the detailed description thereof is omitted herein. The difference between the following embodiments and the first embodiment will be described in detail.

The Second Embodiment

Figure 13:
FIG. 13 is a front view of the package terminal of the second embodiment of the present disclosure.

The difference between the package terminal of the second embodiment shown in FIG. 13 and that of the first embodiment is a chamfer 10 at the top of the end portion 1. During the assembly of the package terminal 12 and the PCB, the package terminal is located through the locating holes in the PCB. The locating holes in the PCB have positive chamfers for improving the assembling efficiency. Thus, the chamfer is formed at the top of the end portion 1 of the package terminal in this embodiment for improving the assembling convenience.

The chamfers 10 can also be formed at the tops of the end portions 1 in the following embodiments, the detailed description thereof is omitted.

The Third Embodiment

Figure 14A:
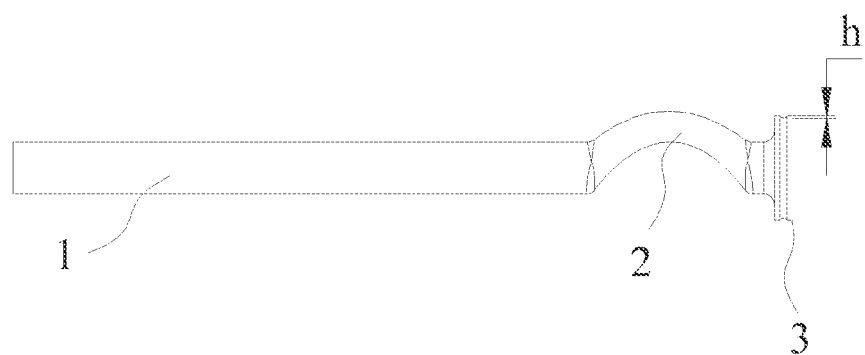
FIG. 14A is a front view of the package terminal of the third embodiment of the present disclosure.
Figure 14B:
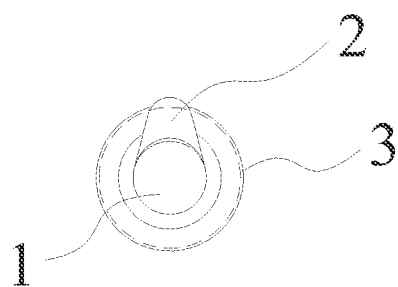
FIG. 14B is a left view of the package terminal of the third embodiment of the present disclosure.

The package terminal in the third embodiment of the present disclosure is shown in FIGS. 14A and 14B.

The difference between third embodiment and the first embodiment lies in an inner groove with a depth of h formed on the cylindrical surface of the base 3. For the soldering connection between the package terminal 12 and the soldering pad of the substrate 11, the soldering strength is improved by the groove of the base 3.

The Forth Embodiment

Figure 15A:
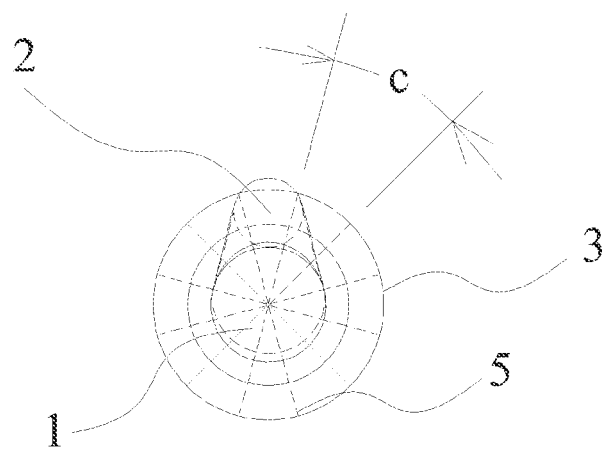
FIG. 15A is a left view of the package terminal of the forth embodiment of the present disclosure.
Figure 15B:
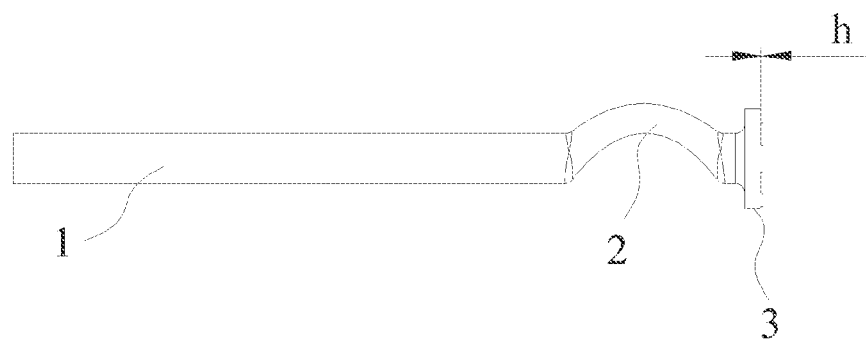
FIG. 15B is a front view of a package terminal of the forth embodiment of the present disclosure.

The package terminal in the forth embodiment of the present disclosure is shown in FIGS. 15A and 15B. The difference between the forth embodiment and the first embodiment is that the base 3 has a bottom surface with a starlike structure. In detail, the bottom surface is divided into n (n=3, 4, 5, 6, 8, 9, 10 and so on) average parts by grooves 5 with a depth of h, i.e., a radial groove structure is formed on the bottom surface of the base 3. With the starlike bottom surface, the solder area between the soldering pad and the package terminal is increased, and the contacting force and the reliability of the soldering interface are improved.

The Fifth Embodiment

Figure 16A:
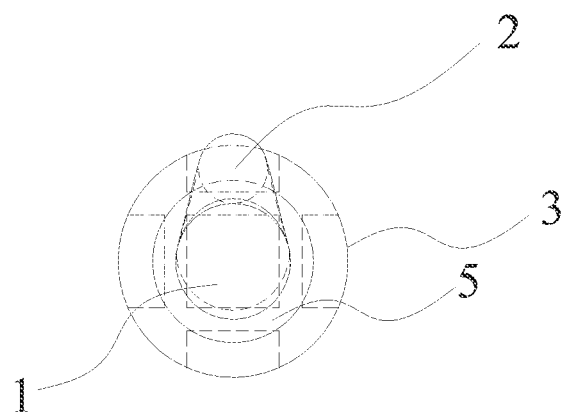
FIG. 16A is a left view of the package terminal of the fifth embodiment of the present disclosure.
Figure 16B:
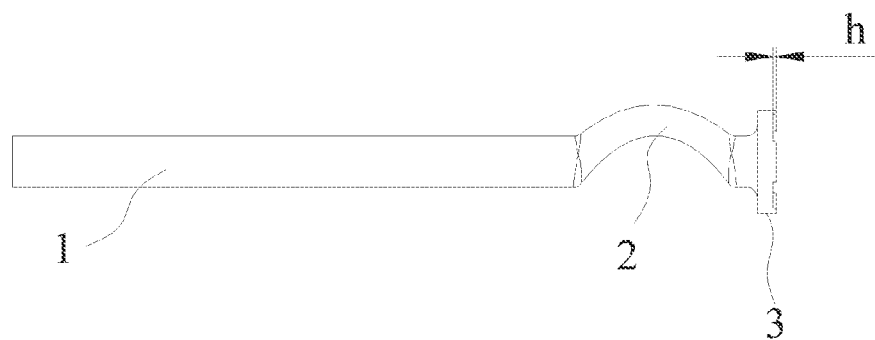
FIG. 16B is a front view of the package terminal of the fifth embodiment of the present disclosure.

The package terminal in the fifth embodiment of the present disclosure is shown in FIGS. 16A and 16B. The difference between the fifth embodiment and the forth embodiment is that the base 3 has a bottom surface with a structure of intersecting parallel grooves of depth h. The structure of intersecting parallel grooves of the fifth embodiment can improve soldering reliability, just like the starlike structure in the forth embodiment.

The base 3 are modified through grooves structures on the bottom surface and/or the cylindrical surface in the third to fifth embodiments. The package terminals of the other embodiments can also employ the grooves structures on the bottom surface and/or the cylindrical surface of the base 3 described in the third to fifth embodiments.

The Sixth Embodiment

Figure 17A:
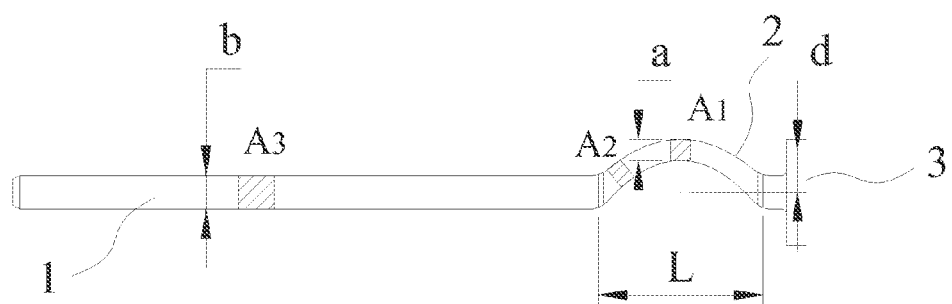
FIG. 17A is a front view of the package terminal of the sixth embodiment of the present disclosure.
Figure 17B:
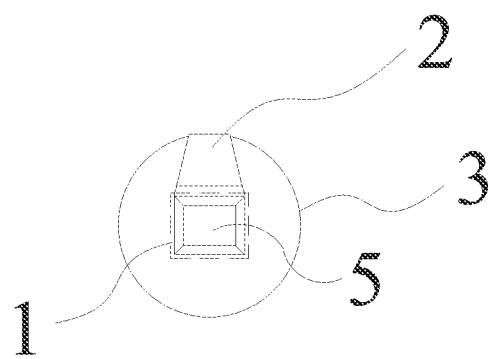
FIG. 17B is a left view of the package terminal of the sixth embodiment of the present disclosure.

The package terminal in the sixth embodiment of the present disclosure is shown in FIGS. 17A and 17B. The difference between the sixth embodiment and the first embodiment is that the round sections of the end portion 1 and the bent portion 2 are replaced by the rectangular sections (which can also be a regular polygon such as a square, a regular pentagon, a regular hexagon or the like according to practical applications). As shown in FIGS. 17A-17B, L represents a length of the bent portion 2, a represents a side length (e.g., a length of the section of the bent portion in the C-shape opening direction) of the second section (i.e., the section of the minimum sectional area of the bent portion 2), b represents a side length (e.g., a length of the section of the end portion 1 in the C-shape opening direction) of the first section (i.e., the section of the maximum sectional area of the bent portion). As all side lengths of a rectangle may not be equal to each other, the side length of the first section is selected as the side length b shown in FIG. 17A, i.e., a projected length of the first section in a direction of the opening direction of the bent portion 2 and perpendicular to the central axis. The length a shown in FIG. 17A is a projected length of the second section in a direction of the opening direction of the bent portion 2 and perpendicular to the central axis.

The "d" represents an offset distance between a center of the second section and a central axis of the package terminal, A1 represents an area of the second section, A2 represents an area of any other gradual section, and A3 is an area of the first section. Thus, there is a relationship of A1<A2<A3. For example, one or more or all of the following relationships are met:

L≥2b, i.e., the length of the bent portion is larger or equal to twice the side length of the first section;

A1≤0.7A3, i.e., the area of the second section is less than or equal to 0.7 times of that of the first section;

a≤0.8b, i.e., the side length of the second section is less than or equal to 0.8 times of that of the first section;

d≥0.5b, i.e., the offset distance from the center of the second section to the central axis of the package terminal is larger than or equal to half of the side length of the first section.

The round section is convenient for processing a bar, and the square section is suitable for plate forming process. The present embodiment is more suitable for mass production.

The Seventh Embodiment

Figure 18A:
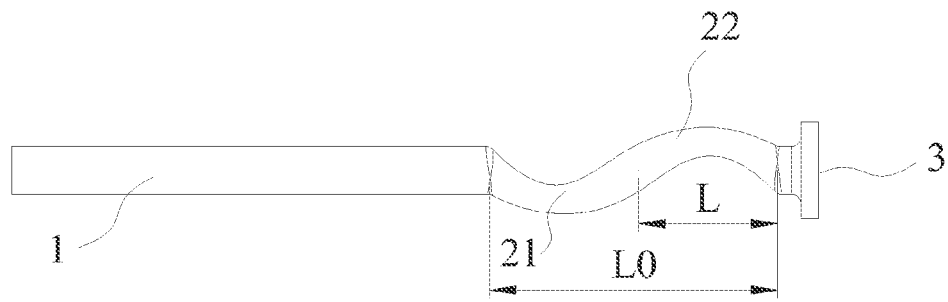
FIG. 18A is a front view of the package terminal of the seventh embodiment of the present disclosure.
Figure 18B:
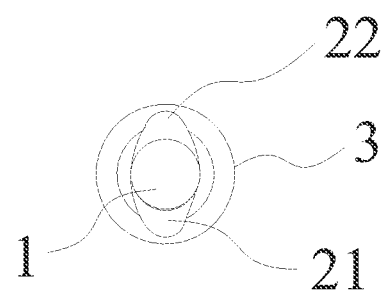
FIG. 18B is a left view of the package terminal of the seventh embodiment of the present disclosure.

The package terminal in the seventh embodiment of the present disclosure is shown in FIGS. 18A and 18B. The difference between the seventh embodiment and the first embodiment is that one C-shape bend of the bent portion 2 is replaced by two C-shape bends 21 and 22, which are center-symmetric and have an equal length of L. The elasticity and the directional mechanical property in this embodiment are better than those in the first embodiment with the single C-shape bent portion 2.

In the package terminal of the present disclosure, the number n of the C-shape bends is not limited to two and may be, for example, 2 to 4. When n is equal to 3, three C-shape bends are symmetrically arranged along circumference at 120 degrees (i.e., a span of each C-shape bend in the circumferential direction of the central axis is 120 degrees) and have an equal length. When n is equal to 4, four C-shape bends are symmetrically arranged along circumference at 90 degrees and have an equal length.

The Eighth Embodiment

Figure 19A:
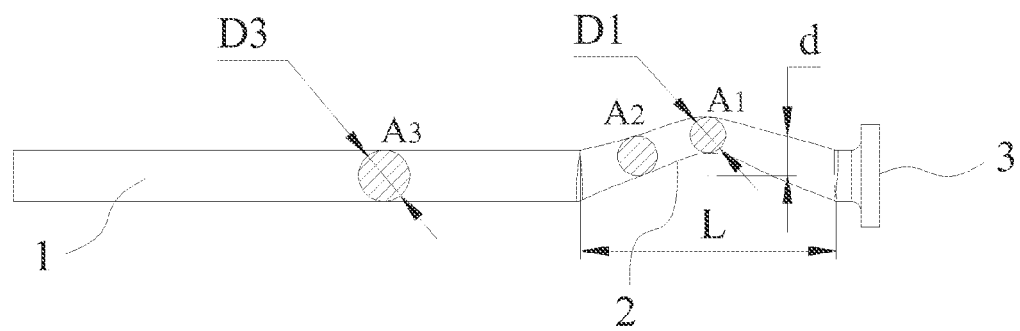
FIG. 19A is a front view of the package terminal of the eighth embodiment of the present disclosure.
Figure 19B:
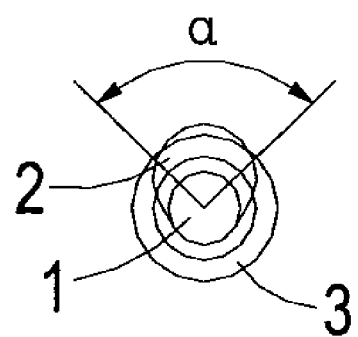
FIG. 19B is a left view of the package terminal of the eighth embodiment of the present disclosure.

The package terminal of the eighth embodiment of the present disclosure is shown in FIGS. 19A and 19B. The difference between the eighth embodiment and the first embodiment is that the bend in a single direction is replaced by a gradual change bend in the circumferential direction of the central axis at predetermined angle, i.e., a span of the bent portion 2 in the circumferential direction of the central axis is α. The bending angle α is increased to control the structure property, where 0°<α<360°. In this embodiment, all the section is round. As shown in figure, L represents a length of the bent portion 2, d represents an offset distance between the center of the second section and the central axis, D1 and A1 represent a diameter and an area of the first section respectively, A2 represents an area of any gradual section, D3 and A3 represent the diameter and the area of the first section respectively.

For example, one or more or all of the following relationships of L≥2D3, A1≤0.7A3, D1≤0.8D3, d≥0.5D3, A1<A2<A3 are met, like in the first embodiment. The gradual change bent structure in the circumferential direction in this embodiment is equivalent to a part of a spring structure, which may result in a better elastic property.

The Ninth Embodiment

Figure 20A:
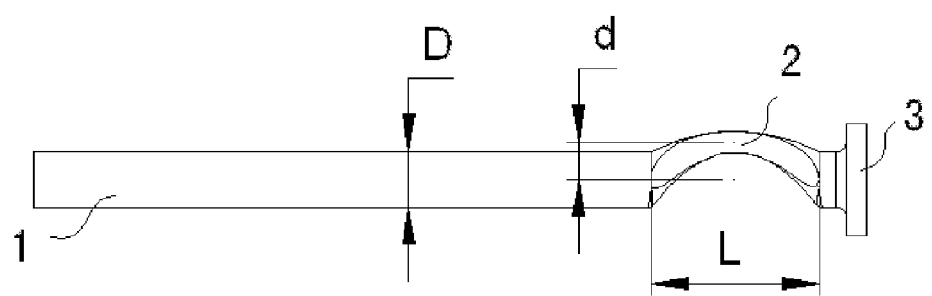
FIG. 20A is a front view of the package terminal of the ninth embodiment of the present disclosure.
Figure 20B:
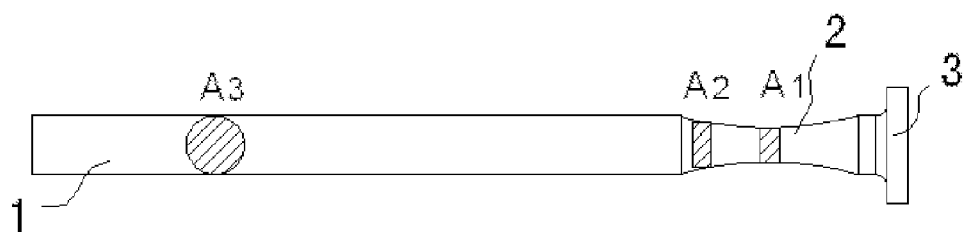
FIG. 20B is a top view of the package terminal of the ninth embodiment of the present disclosure.
Figure 20C:
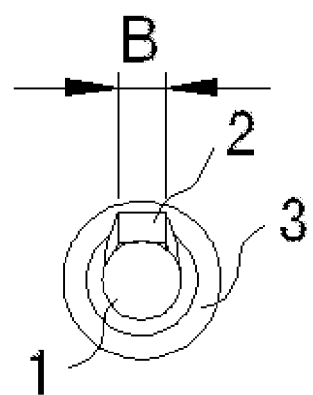
FIG. 20C is a left view of the package terminal of the ninth embodiment of the present disclosure.

The package terminal of the ninth embodiment is shown in FIGS. 20A, 20B, and 20C. The difference between the ninth embodiment and the first embodiment is that the round gradual change section of the bent portion is replaced by a rectangular gradual change section. As shown in figure, L represents a length of the bent portion (i.e., a distance between the first end and the second end of the bent portion 2), B represents the length of the centre part of the bent portion in a direction perpendicular to the opening direction of C-shape, D represents a diameter of the first section, d represents an offset distance between the geometric center of the second section and the central axis of the package terminal, A1 represents an area of the second section, A2 presents an area of any gradual section, A3 represents an area of the first section, and there is a relationship of A1≤A2≤A3. For example, one or more or all of the following relationships of L≥2D, d≥0.5D, A1≤0.7A3 are met.

Although the directional selectivity of the mechanical property in this embodiment becomes significant, however, the processing becomes convenient.

According to embodiments of the disclosure, the section of the end portion 1 and the bent portion 2 of the package terminal can be of different shapes such as a round shape, an oval shape, a rectangular shape, and a regular polygon shape including square, regular pentagon, regular hexagon and so on.

One or more embodiments of the present disclosure thus provide at least one of the following advantages.

The package terminals according to various embodiments in the present disclosure release stress through the bent portion 2. Thus, the problems of overlarge stress concentration at the solder area and the directional selectivity of the elastic force are solved, and the reliability of the product is improved.

Stress is released through a C-shape bent portion having a gradual section.

The maximum stress is distributed at the bent portion of the package terminal to achieve an isotropic stress-releasing effect.

Due to the gradual section of the bent portion, the stress can be concentrate on the section of the minimum sectional area.

As the round section, oval section, rectangular section, or regular polygonal section behaves approximately isotropically, the stress-releasing effect without the directional selectivity is achieved through combination of the gradual section and the C-shape bend.

The connection reliability of the package terminal is improved without limitation to the specific sizes of the bent portion and the section thereof.

It should be noted that the above embodiments are only illustrated for describing the technical solution of the disclosure and not restrictive, and although the disclosure is described in detail by referring to the aforesaid embodiments, the skilled in the art should understand that the aforesaid embodiments can be modified and portions of the technical features therein may be equally changed, which does not depart from the spirit and scope of the technical solution of the embodiments of the disclosure.

Which we claim is:

1. A package terminal, comprising:
   a base;
   an end portion with a first section; and
   a bent portion having C-shape bend with a gradual change section, wherein the bent portion includes a first end and a second end, the first end is connected to the end portion, the second end is connected to the base, the bent portion includes a second section, and an area of the second section is smaller than an area of the first section;
   wherein the package terminal has a central axis, the first section and the second section are perpendicular to the central axis, the first section has a maximum sectional area among all of sections perpendicular to the central axis of the end portion, and the second section has a minimum sectional area among all of the sections of the bent portion; and
   wherein the first section and the second section are round, a diameter of the second section is less than or equal to 0.8 times of a diameter of the first section.

2. The package terminal as claimed in claim 1, wherein the area of the second section is less than or equal to 0.7 times of the area of the first section.

3. The package terminal as claimed in claim 1, wherein a distance between the first end and the second end of the bent portion is larger than or equal to twice the side length diameter of the first section in a direction of an opening direction of the bent portion and perpendicular to a direction of the central axis.

4. The package terminal as claimed in claim 1, wherein a distance between a center of the second section and the central axis is larger than or equal to half of the diameter of the first section.

5. The package terminal as claimed in claim 1, further comprising a chamfer at a top of the end portion.

6. The package terminal as claimed in claim 1, wherein the bent portion comprises two to four C-shape bends arranged end to end and uniformly along a circumferential direction.

7. The package terminal as claimed in claim 1, wherein the C-shape bend is a bend in a single direction or a gradual change bend in a circumferential direction at a predetermined angle.

8. The package terminal as claimed in claim 1, wherein a material of the bent portion is the same as or different from that of the base or the end portion.

9. A package module, comprising:
   a carrier member including a plurality of soldering pads;
   a plurality of package terminals of claim 1, wherein the base of the package terminal is fixed to the soldering pad.

10. A package terminal, comprising:
    a base;
    an end portion with a first section; and
    a bent portion having C-shape bend with a gradual change section, wherein the bent portion includes a first end and a second end, the first end is connected to the end portion, the second end is connected to the base, the bent portion includes a second section, and an area of the second section is smaller than an area of the first section;
    wherein the package terminal has a central axis, the first section and the second section are perpendicular to the central axis, the first section has a maximum sectional area among all of sections perpendicular to the central axis of the end portion, and the second section has a minimum sectional area among all of the sections of the bent portion; and
    wherein the first section and the second section are regular polygonal, a side length of the second section is less than or equal to 0.8 times of a side length of the first section.

11. The package terminal as claimed in claim 10, wherein the area of the second section is less than or equal to 0.7 times of the area of the first section.

12. The package terminal as claimed in claim 10, wherein a distance between the first end and the second end of the bent portion is larger than or equal to twice the side length of the first section in a direction of an opening direction of the bent portion and perpendicular to a direction of the central axis.

13. The package terminal as claimed in claim 10, wherein a distance between a center of the second section and the central axis is larger than or equal to half of the side length of the first section.

14. The package terminal as claimed in claim 10, further comprising a chamfer at a top of the end portion.

15. The package terminal as claimed in claim 10, wherein the bent portion comprises two to four C-shape bends arranged end to end and uniformly along a circumferential direction.

16. The package terminal as claimed in claim 10, wherein the C-shape bend is a bend in a single direction or a gradual change bend in a circumferential direction at a predetermined angle.

17. The package terminal as claimed in claim 10, wherein a material of the bent portion is the same as or different from that of the base or the end portion.

18. A package module, comprising:
    a carrier member including a plurality of soldering pads;
    a plurality of package terminals of claim 10, wherein the base of the package terminal is fixed to the soldering pad.

19. A package terminal, comprising:
a base;
an end portion with a first section;
a bent portion having C-shape bend with a gradual change section, wherein the bent portion includes a first end and a second end, the first end is connected to the end portion, the second end is connected to the base, the bent portion includes a second section, and an area of the second section is smaller than an area of the first section; and
a groove around a cylindrical surface of the base.

20. A package terminal, comprising:
a base;
an end portion with a first section;
a bent portion having C-shape bend with a gradual change section, wherein the bent portion includes a first end and a second end, the first end is connected to the end portion, the second end is connected to the base, the bent portion includes a second section, and an area of the second section is smaller than an area of the first section; and
a plurality of grooves forming a starlike structure or an intersecting parallels structure on a bottom surface of the base.

* * * * *